(12) United States Patent
Spruth et al.

(10) Patent No.: US 9,384,856 B2
(45) Date of Patent: Jul. 5, 2016

(54) MEMORIES HAVING A BUILT-IN SELF-TEST (BIST) FEATURE

(71) Applicants: Henning F. Spruth, Austin, TX (US); Qadeer A. Qureshi, Dripping Springs, TX (US); Reinaldo Silveira, Sao Paulo (BR)

(72) Inventors: Henning F. Spruth, Austin, TX (US); Qadeer A. Qureshi, Dripping Springs, TX (US); Reinaldo Silveira, Sao Paulo (BR)

(73) Assignee: Freescale Semiconductor, Inc., Austin, TX (US)

( * ) Notice: Subject to any disclaimer, the term of this patent is extended or adjusted under 35 U.S.C. 154(b) by 147 days.

(21) Appl. No.: 14/102,727

(22) Filed: Dec. 11, 2013

(65) Prior Publication Data

US 2015/0162098 A1    Jun. 11, 2015

(51) Int. Cl.
| | | |
|---|---|---|
| *G11C 29/00* | (2006.01) | |
| *G11C 29/38* | (2006.01) | |
| *G06F 11/263* | (2006.01) | |
| *G11C 29/42* | (2006.01) | |
| *G11C 29/44* | (2006.01) | |

(52) U.S. Cl.
CPC .............. *G11C 29/38* (2013.01); *G06F 11/263* (2013.01); *G11C 29/42* (2013.01); *G11C 29/44* (2013.01); *G11C 2029/4402* (2013.01)

(58) Field of Classification Search
CPC ...... G06F 11/263; G11C 29/38; G11C 29/26; G11C 29/18; G11C 29/44; G11C 2029/0405; G11C 2029/2602; G11C 29/4401; G11C 29/72; G11C 2029/4402; G11C 2029/0401; G11C 29/16; G11C 2029/1208; G11C 29/40; G11C 17/14; G11C 2029/3202; G11C 2029/3602; G11C 2029/1806; G11C 29/56; G11C 2029/5606; G11C 2029/5604; G01R 31/318544; H03K 19/1776; H03K 19/17764

See application file for complete search history.

(56) References Cited

U.S. PATENT DOCUMENTS

| | | | |
|---|---|---|---|
| 5,912,901 A * | 6/1999 | Adams et al. | 714/733 |
| 6,643,807 B1 * | 11/2003 | Heaslip et al. | 714/719 |
| 7,370,251 B2 | 5/2008 | Nadeau-Dostie et al. | |
| 7,415,641 B1 * | 8/2008 | Behera et al. | 714/711 |
| 7,536,614 B1 * | 5/2009 | Ma et al. | 714/723 |
| 2004/0049724 A1 * | 3/2004 | Bill et al. | 714/733 |
| 2004/0268198 A1 * | 12/2004 | Ouellette | G11C 29/44 714/733 |
| 2006/0031726 A1 * | 2/2006 | Zappa et al. | 714/718 |
| 2006/0248414 A1 * | 11/2006 | Dubey | 714/718 |
| 2006/0253723 A1 * | 11/2006 | Wu et al. | 714/1 |
| 2007/0011535 A1 * | 1/2007 | Anzou et al. | 714/733 |
| 2007/0136626 A1 * | 6/2007 | Chung | 714/718 |
| 2008/0022176 A1 * | 1/2008 | Anzou et al. | 714/733 |
| 2008/0282121 A1 * | 11/2008 | Rajeev et al. | 714/719 |
| 2009/0024885 A1 * | 1/2009 | Anzou et al. | 714/719 |
| 2009/0172483 A1 * | 7/2009 | Anzou et al. | 714/723 |
| 2012/0229155 A1 * | 9/2012 | Anzou et al. | 324/750.3 |
| 2013/0021861 A1 * | 1/2013 | Shvydun et al. | 365/200 |
| 2013/0070545 A1 * | 3/2013 | Anzou et al. | 365/200 |
| 2014/0146624 A1 * | 5/2014 | Son et al. | 365/200 |
| 2014/0245087 A1 * | 8/2014 | Tokunaga et al. | 714/718 |

OTHER PUBLICATIONS

Mukherjee, N. et al, "High Volume Diagnosis in Memory BIST Based on Compressed Failure Data", IEEE Transactions on Computer-Aided Design of Integrated Circuits and Systems, vol. 29, No. 3, Mar. 2010, pp. 441-453.

* cited by examiner

*Primary Examiner* — Guerrier Merant

(57) ABSTRACT

A memory system includes a memory and a built-in self-test (BIST) unit coupled to the memory. The BIST unit is configured to run a test pattern on the memory to accumulate a fault signature, and store fault signature information based on the accumulated fault signature at multiple locations in the memory.

21 Claims, 3 Drawing Sheets

MEMORIES HAVING A BUILT-IN SELF-TEST (BIST) FEATURE

BACKGROUND

1. Field

This disclosure relates generally to memories, and more specifically, to built-in self-testing of memories.

2. Related Art

It has become common for integrated circuits with memories to have built-in self-test (BIST) logic to test memories. As both the number of memories and the total amount of memory on integrated circuits are increasing, the BIST has become increasingly important. The BIST itself can occupy a large amount of area on the integrated circuit that directly affects the cost of the integrated circuit. At the same time, it is important that the testing itself be effective. Of course it is important that the memories on the integrated circuit meet certain specifications, but it is also useful to identify the particular bits that are failing within a word. This is necessary in determining if redundancy can be implemented and is also useful for evaluating a design or process for future designs and processes.

Accordingly there is a need to provide further improvement in BIST of memories.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a built-in self-test (BIST) tests each memory of a plurality of memories, generates fault signature information for each memory, and stores the fault signature information in the memory to which it pertains. The fault signature information identifies each bit location that has at least one failure. The fault signature information is stored in multiple locations in the memory and may be stored in different forms. Although one or more entries may have been written into a defective location, an error correction algorithm can be used to read the fault signature information to compensate for the fact that one or more entries of the fault signature information into the memory may have been to a location that is defective. This is better understood by reference to the drawings and the following description.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
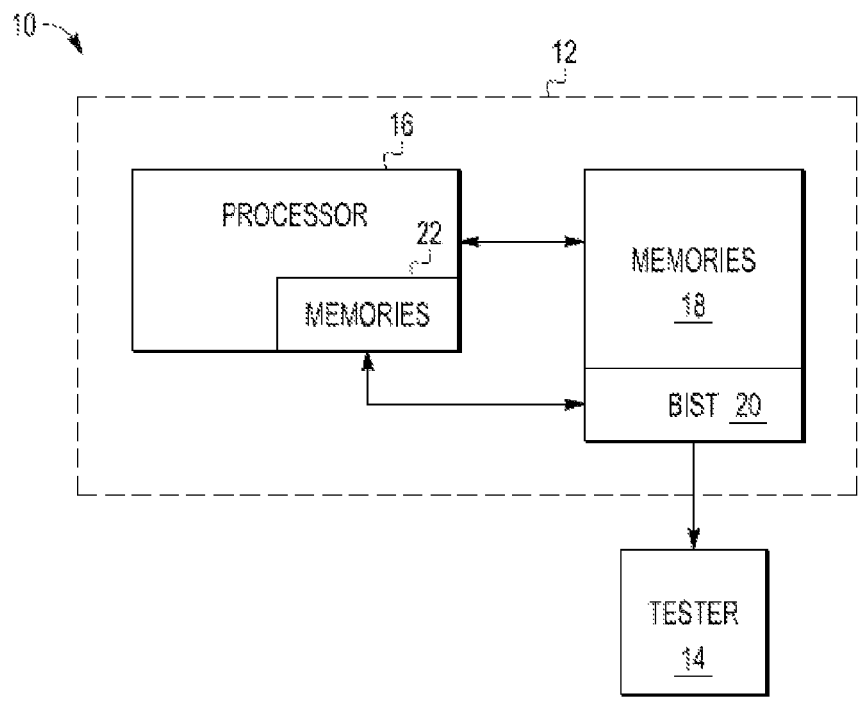
FIG. 1 is a block diagram of a system having a tester and an integrated circuit having a plurality of memories, a processor, and a built-in self-test (BIST)

Shown in FIG. 1 is a system 10 having an integrated circuit 12 and a tester 14 outside integrated circuit 12. Integrated circuit 12 has a processor 16, a plurality of memories 18, and a BIST 20 that may be coupled to tester 14. Processor 16, in addition to having processing circuitry, has a plurality of memories 22. BIST 20 is coupled to plurality of memories 18 and plurality of memories 22. Processor 16, in performing its processing functions, accesses plurality of memories 18 and plurality of memories 22.

Figure 2:
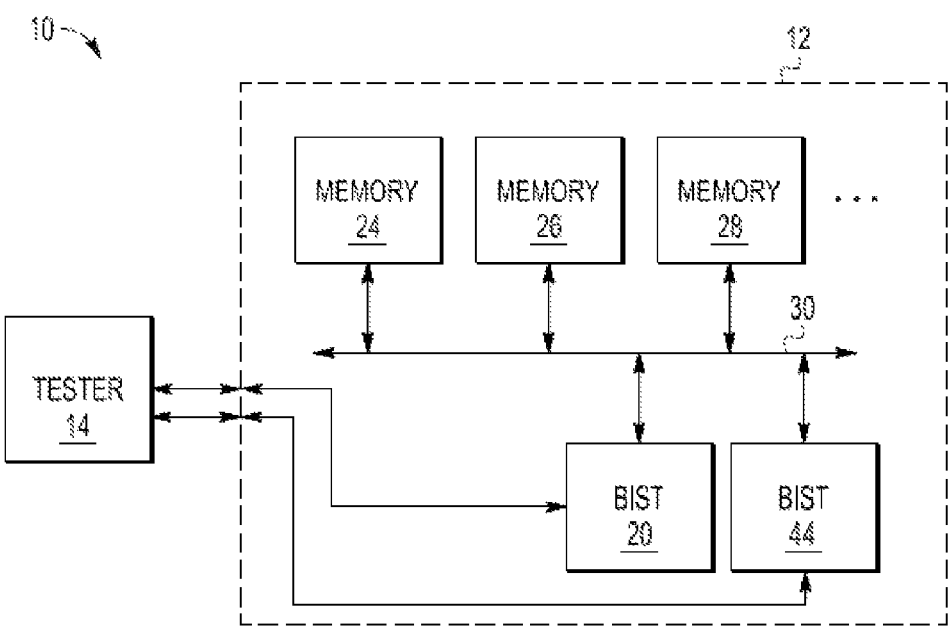
FIG. 2 is a portion of the system of FIG. 1 shown in more detail.

Shown in FIG. 2 is a portion of system 10 having a bus 30 with memories 24, 26, and 28 and BIST 20 coupled thereto. Many other memories may also be coupled to bus 30 and be tested by BIST 20. Memories 24, 26, and 28 are representative of memories of plurality of memories 18 and plurality of memories 22 that are tested by BIST 20. In performing the testing of memories 24, 26, and 28, BIST 20 is responsive to tester 14 when tester is coupled to BIST 20. Optionally, BIST 44 may be used to test memories simultaneously with BIST 20.

Figure 3:
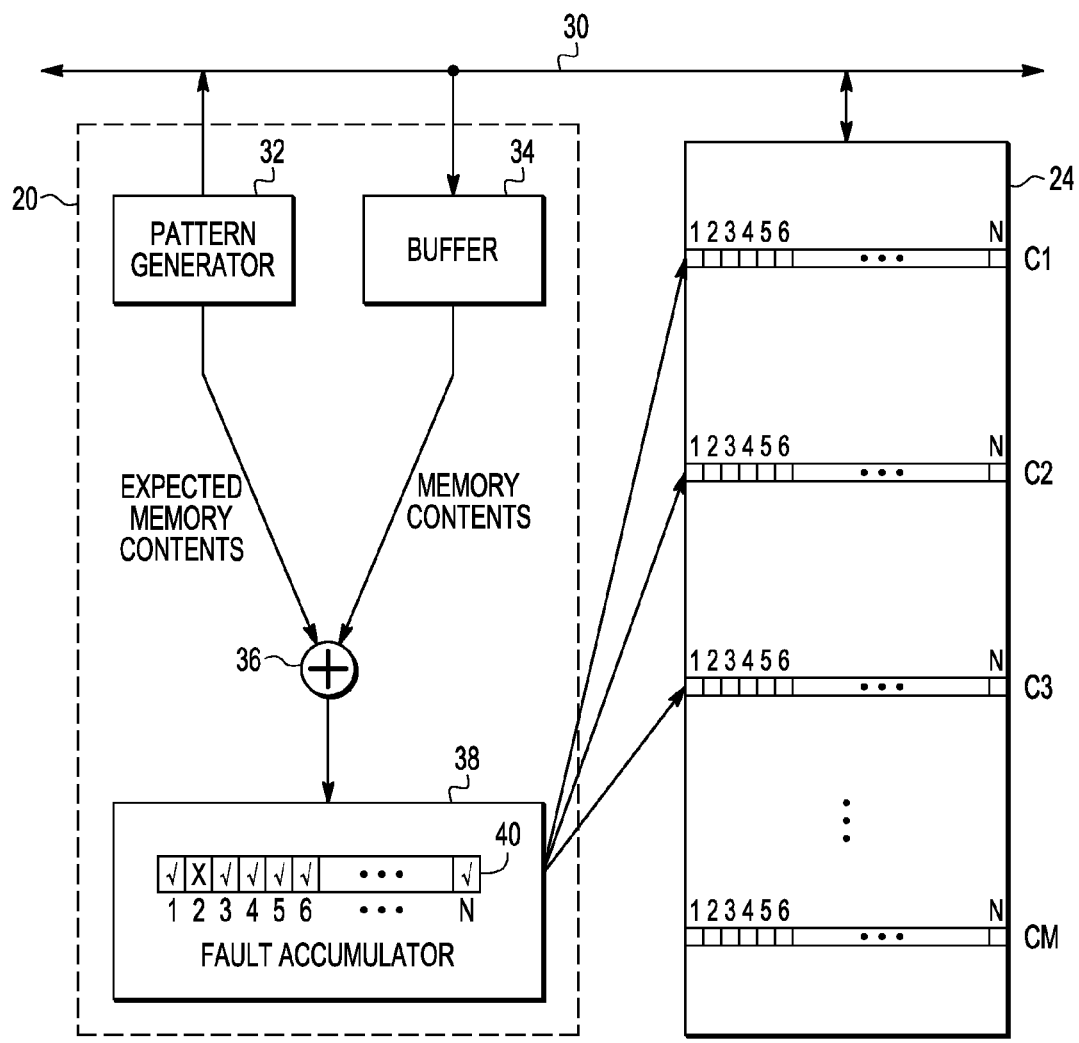
FIG. 3 is block diagram of a memory of the plurality memories and BIST.

Shown in FIG. 3 are bus 30, BIST 20, and memory 24 in more detail. BIST 20 includes a pattern generator 32 coupled to bus 30, a buffer 34, an exclusive OR circuit 36, and a fault accumulator 38 that includes a fault signature register 40. Fault signature register is shown as having bit locations 0, 1, 2, 3, 4, 5, 6, and N, N being the last bit location and there being more bit locations between bit location 6 and bit location N. Pattern generator 32 may receive a test pattern from tester 14, provide the pattern to memory 24 through bus 30, and provide the expected memory contents to an input of exclusive OR 36. Fault signature register 40 has as many bit locations as the maximum number of bit locations of the words in any of the pluralities of memories that BIST 20 is used to test. In response to the test pattern, memory 24 provides contents of the particular memory location being accessed to buffer 34 through bus 30. Buffer 34, being coupled to an input of exclusive OR 36, provides the contents of the particular memory location being accessed. If exclusive OR 36 receives the same information from both buffer 34 and pattern generator 32, then no change is made to fault signature register 40 because the memory contents match the expected memory contents. Each memory location of memory 24 is in turn tested in this manner. Any time the output of buffer 34 differs from the expected memory contents, exclusive OR 36 will provide an indication of an error. The particular bit location of fault signature register 40 will be switched to indicate a failure has occurred at that bit location the first time a failure is detected at that bit location. This is shown as an "x" at bit location 3 in FIG. 3. A check mark is used to show that no failure has been detected at that bit location. At any time during the testing of memory 24 in this manner that a bit location is found to be in error, fault accumulator 38 will make sure that the particular bit location or locations will be identified as having had a fault.

After all of memory 24 has been tested, the accumulation of all of the different bit locations that had been found to have a failure are identified by having that bit location set to indicate a failure. As indicated previously, an "x" is used in FIG.

3 to show that at least one failure has occurred at bit location 2. Of the bit locations shown in FIG. 3, bit locations 1, 3, 4, 5, 6, and N all show that no failures have been discovered for those locations. After the test of memory 24 is complete, the information in fault signature register 40 is written into multiple locations of memory 24. In this example, word locations C1, C2, and C3 are written with the information of fault signature register 40. Word location CM represents one or more additional word locations that may also be written with the information contained in fault signature register 40. Writing the information may be directly copying the contents of fault signature register 40 but does not necessarily have to be a direct copy. Examples of alternatives include inverting the contents of fault signature register or shifting the contents. For example, word locations C1, C2, and C3 may be filled with the exact contents of fault signature register 40, at least to the extent of the length of word locations C1, C2, and C3. Word locations of the various memories of the plurality of memories may have shorter lengths than the length of fault signature register 40. Using multiple locations and then an error correction algorithm takes into account the possibility that a word location being written may itself have a failure. Thus word locations C1, C2, and C3 are analyzed using an error correction algorithm to determine a final fault signature. If all of the word locations that have the fault signature information are written with the exact contents of fault signature register 40, then a simple majority vote system can be used to compare the contents of word locations C1, C2, and C3 to determine a final fault signature.

It may be found that using different mapping schemes, such as inversion, from fault signature register 40 to memory locations C1, C2, and C3 may provide more reliable results in which case a more involved error correction algorithm may be required.

Figure 4:
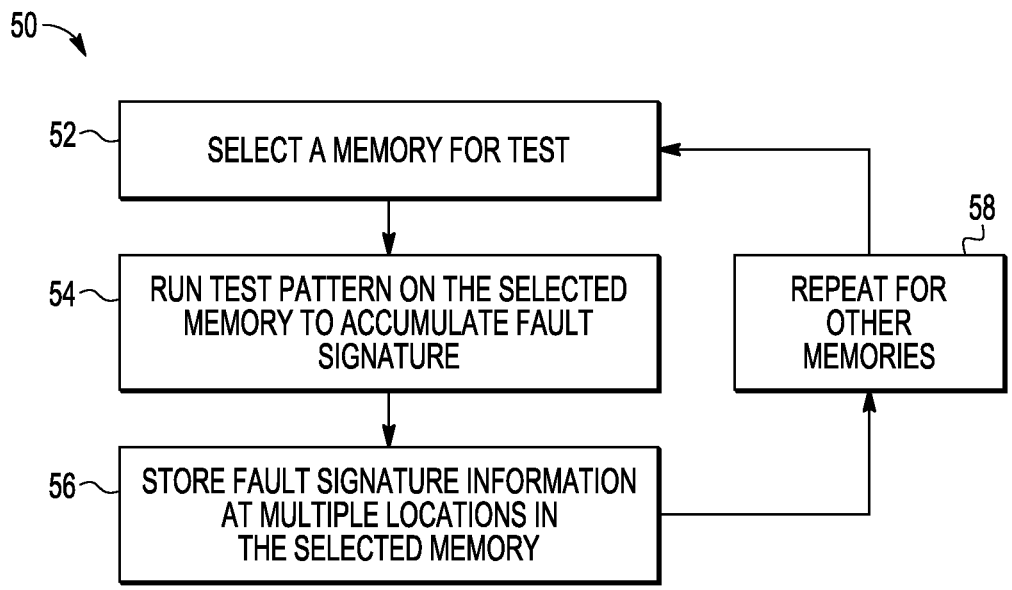
FIG. 4 is a flow chart useful in understanding the operation of the system of FIG. 1.

Shown in FIG. 4 is a method 50 of performing a BIST operation on a plurality of memories on an integrated circuit. This begins with selecting a memory for test as shown in step 52. This can be, for example, memory 24 of FIGS. 2 and 3. A test pattern is then run on the selected memory to accumulate a fault signature as shown in step 54. This is conveniently accumulated in a register in which each bit location indicates if one or more word locations has a failure at that bit location. The fault signature information is then stored at multiple locations in the selected memory as shown in step 56. For relatively simple error correction, this information can be in the same form in all of the locations, the number of locations being odd. This allows for a simple majority vote type of error correction. After storing the fault signature information at multiple locations in the memory, the process is repeated for each of the other memories. This approach allows for needing only one BIST, but this approach could also be used with more than one BIST operating simultaneously.

Figure 5:
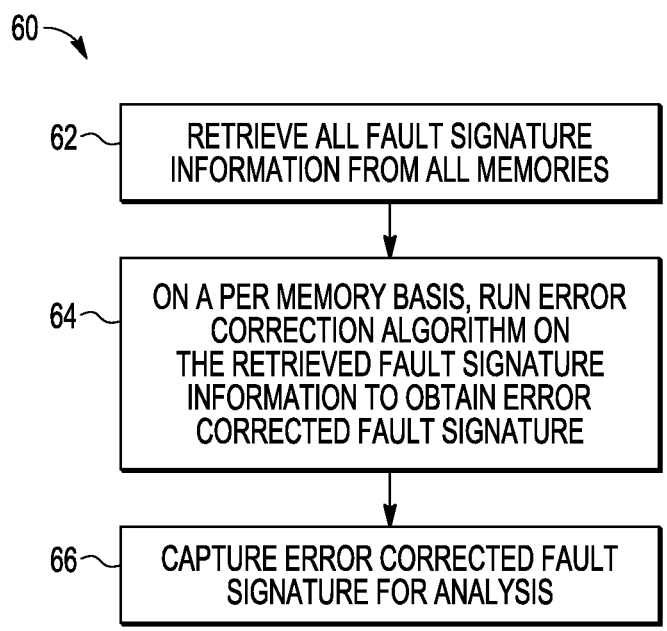
FIG. 5 is another flow chart useful in understanding the operation of the system of FIG. 1.

Shown in FIG. 5 is a method 60 for obtaining the fault signature for a memory that has utilized method 50 of FIG. 4. The various locations having fault signature information are retrieved from all of the memories as shown in step 62. For each memory, an error correction is run on the retrieved fault signature information to obtain an error corrected fault signature as shown in step 64. As indicated, using a majority vote error correction approach would be very efficient. After the error correction has been applied, the error corrected fault signature is captured for analysis as shown in step 66.

Loading error information into a memory that may have failures can be effective by using error correction. If there are excessive errors to the extent that the error correction is not effective, the errors are so extensive that the memory is certain to be a failed memory. The source of the errors would be readily discernible and not require BIST. There would be expected to find conspicuous anomalies due to something that went wrong in the manufacturing process.

By now it should be appreciated that there has been provided a memory system a memory and a built-in self-test (BIST) unit coupled to the memory. The BIST unit is configured to run a test pattern on the memory to accumulate a fault signature and store fault signature information based on the accumulated fault signature at multiple locations in the memory. The memory system may have a further characterization by which the BIST unit is further configured to encode the accumulated fault signature in accordance with an error correcting algorithm to form the fault signature information. The memory system may have a further characterization by which storing the fault signature information based on the accumulated fault signature comprises storing the accumulated fault signature at the multiple locations in the memory. The memory system may have a further characterization by which the multiple locations in the memory is an odd number of memory locations. The memory system may have a further characterization by which the multiple locations in the memory correspond to predetermined locations of the memory which are spaced apart from each other. The memory system may have a further characterization by which storing the fault signature information based on the accumulated fault signature comprises storing the accumulated fault signature at at least one of the multiple locations in the memory and storing an inverse of the accumulated fault signature at at least one of the multiple locations in the memory. The memory system may further have a second memory and a second BIST unit coupled to the second memory, wherein second BIST unit is configured to run a second test pattern on the second memory to accumulate a second fault signature and store second fault signature information based on the second accumulated fault signature at multiple locations in the second memory. The memory system may have a further characterization by which the multiple locations in the memory correspond to predetermined locations of the memory which are spaced apart from each other. The memory system may have a further characterization by which the memory system further includes a second BIST unit coupled to the second memory, wherein the second BIST unit is configured to run a second test pattern on the second memory to accumulate a second fault signature and store second fault signature information based on the second accumulated fault signature at multiple locations in the second memory.

Also described is a memory system having a memory and BIST unit coupled to the memory. The BIST unit includes a pattern generator configured to apply a test pattern to the memory, a comparator configured to, in response to application of the test pattern, compare data read from the memory with expected data, a fault accumulator configured to accumulate a fault signature for the memory based on comparisons performed by the comparator, and control circuitry configured to store fault signature information based on the accumulated fault signature at multiple locations of the memory. The memory system may further include a second memory and may have a further characterization by which the pattern generator of the BIST unit is further configured to apply a second test pattern to the second memory, the comparator is further configured to, in response to application of the second test pattern, compare second read data from the second memory with second expected data, the fault accumulator is further configured to accumulate a second fault signature for the second memory based on comparisons performed by the comparator, and the control circuitry is further configured to store second fault signature information based on the accumulated second fault signature at multiple locations of the second memory. The memory system may have a further characterization by which the fault accumulator includes a single register configured to store the accumulated fault signature during testing of the memory and the accumulated second signature during testing of the second memory. The memory system may have a further characterization by which the BIST unit is further configured to encode the accumulated fault signature in accordance with an error correcting algorithm to form the fault signature information. The memory system may have a further characterization by which storing the fault signature information based on the accumulated fault signature comprises storing the accumulated fault signature at the multiple locations in the memory. The memory system may have a further characterization by which the multiple locations in the memory is an odd number of memory locations. The memory system may have a further characterization by which storing the fault signature information based on the accumulated fault signature comprises storing the accumulated fault signature at at least one of the multiple locations in the memory and storing an inverse of the accumulated fault signature at at least one of the multiple locations in the memory.

Described also is a method including selecting a first memory for testing. The method further includes running a test pattern on the selected first memory to accumulate a fault signature for the memory. The method further includes storing fault signature information based on the accumulated fault signature at multiple locations in the selected first memory. The method may further include, prior to the storing the fault signature information, encoding the accumulated fault signature in accordance with an error correcting algorithm to form the fault signature information. The method may have a further characterization by which the storing the fault signature information based on the accumulated fault signature comprises storing the accumulated fault signature at the multiple locations in the selected first memory. The method may further include retrieving the fault signature information from the memory and running an error correction algorithm on the retrieved fault signature information for the memory to generate an error corrected fault signature for the selected first memory.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, fail signatures pertaining to a plurality of memories could be stored at various locations in a single memory. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
   a memory; and
   a built-in self-test (BIST) unit coupled to the memory, wherein the BIST unit is configured to:
   run a test pattern on the memory to accumulate a fault signature; and
   store fault signature information based on the accumulated fault signature at multiple locations in the memory, wherein
   a same copy of the fault signature information is stored at two or more of the multiple locations in the memory on which the test pattern is run.

2. The memory system of claim 1, wherein the BIST unit is further configured to encode the accumulated fault signature in accordance with an error correcting algorithm to form the fault signature information.

3. The memory system of claim 1, wherein the BIST unit is configured to store the fault signature information based on the accumulated fault signature by being further configured to store the accumulated fault signature at the multiple locations in the memory.

4. The memory system of claim 3, wherein the multiple locations in the memory are an odd number of memory locations.

5. The memory system of claim 3, where the multiple locations in the memory correspond to predetermined locations of the memory which are spaced apart from each other.

6. The memory system of claim 1, wherein the BIST unit is configured to store the fault signature information based on the accumulated fault signature by being further configured to store the accumulated fault signature at ones of the multiple locations in the memory, and store an inverse of the accumulated fault signature at others of the multiple locations in the memory.

7. The memory system of claim 1, wherein the memory system further comprises:
   a second memory; and
   a second BIST unit, coupled to the second memory, and configured to:
   run a second test pattern on the second memory to accumulate a second fault signature; and
   store second fault signature information based on the second accumulated fault signature at multiple locations in the second memory on which the second test pattern is run.

8. The memory system of claim 1, where the multiple locations in the memory correspond to predetermined locations of the memory which are spaced apart from each other.

9. The memory system of claim 1, wherein the memory system further comprises:
   a second memory, wherein the BIST unit is coupled to the second memory and further configured to:
   run a second test pattern on the second memory to accumulate a second fault signature; and store second fault signature information based on the second accumulated fault signature at multiple locations in the second memory on which the second test pattern is run.

10. A memory system, comprising:
a memory; and
a BIST unit coupled to the memory, comprising:
   a pattern generator configured to apply a test pattern to the memory;
   a comparator configured to, in response to application of the test pattern, compare data read from the memory with expected data;
   a fault accumulator configured to accumulate a fault signature for the memory based on comparisons performed by the comparator; and
   control circuitry configured to store fault signature information based on the accumulated fault signature at multiple locations of in the memory, wherein
   a same copy of the fault signature information is stored at two or more of the multiple locations in the memory on which the test pattern is run.

11. The memory system of claim 10, further comprising:
a second memory, wherein:
   the pattern generator of the BIST unit is further configured to apply a second test pattern to the second memory;
   the comparator is further configured to, in response to application of the second test pattern, compare second read data from the second memory with second expected data;
   the fault accumulator is further configured to accumulate a second fault signature for the second memory based on comparisons performed by the comparator; and
   the control circuitry is further configured to store second fault signature information based on the accumulated second fault signature at multiple locations of in the second memory on which the second test pattern is run.

12. The memory system of claim 11, wherein the fault accumulator includes a single register configured to store the accumulated fault signature during testing of the memory and the accumulated second signature during testing of the second memory.

13. The memory system of claim 10, wherein the BIST unit is further configured to encode the accumulated fault signature in accordance with an error correcting algorithm to form the fault signature information.

14. The memory system of claim 10, wherein the control circuitry is configured to store the fault signature information based on the accumulated fault signature by being further configured to store the accumulated fault signature at the multiple locations in the memory.

15. The memory system of claim 14, wherein the multiple locations in the memory are an odd number of memory locations.

16. The memory system of claim 10, wherein the control circuitry is configured to store the fault signature information based on the accumulated fault signature by being further configured to store the accumulated fault signature at ones of the multiple locations in the memory and store an inverse of the accumulated fault signature at others of the multiple locations in the memory.

17. A method comprising:
selecting a first memory for testing;
running a test pattern on the selected first memory to accumulate a fault signature for the memory; and
storing fault signature information based on the accumulated fault signature at multiple locations in the selected first memory, wherein
   a same copy of the fault signature information is stored at two or more of the multiple locations in the selected first memory on which the test pattern is run.

18. The method of claim 17, further comprising, prior to the storing the fault signature information, encoding the accumulated fault signature in accordance with an error correcting algorithm to form the fault signature information.

19. The method of claim 17, wherein the storing the fault signature information based on the accumulated fault signature comprises storing the accumulated fault signature at the multiple locations in the selected first memory.

20. The method of claim 17, further comprising:
retrieving the fault signature information from the multiple locations in the selected first memory; and
running an error correction algorithm on the retrieved fault signature information for the memory to generate an error corrected fault signature for the selected first memory.

21. The method of claim 20, wherein the running the error correction algorithm comprises
comparing the fault signature information retrieved from each of the multiple locations to determine a final fault signature information, wherein
   a majority of the fault signature information retrieved from each of the multiple locations indicates a same fault signature information, and
   the final fault signature information comprises the same fault signature information.

* * * * *